United States Patent [19]
Abe

[11] Patent Number: 5,177,593
[45] Date of Patent: Jan. 5, 1993

[54] DISPLAY DEVICE WITH LEDS HAVING A REDUCTION OF THE THERMAL EXPANSION COEFFICIENTS AMOUNG THE ASSOCIATED COMPONENTS

[75] Inventor: Munezo Abe, Nara, Japan

[73] Assignee: Sharp Kabushiki Kaisha, Osaka, Japan

[21] Appl. No.: 576,653

[22] Filed: Sep. 4, 1990

[30] Foreign Application Priority Data
Sep. 4, 1989 [JP] Japan .............................. 1-103839[U]

[51] Int. Cl.$^5$ ................... H01L 29/161; H01L 33/00; H01L 23/48; H01L 23/29
[52] U.S. Cl. ........................................ 257/98; 257/88; 257/100
[58] Field of Search ....................... 357/16, 17, 72, 74, 357/81, 70, 72, 19

[56] References Cited
U.S. PATENT DOCUMENTS
4,942,454  7/1990  Mori et al. .............................. 357/70

FOREIGN PATENT DOCUMENTS
0018190  2/1977  Japan ..................................... 357/17
0017573  1/1988  Japan ..................................... 357/17

OTHER PUBLICATIONS
"Introduction to MID (Molded Interconnection Device)".

Primary Examiner—Andrew J. James
Assistant Examiner—Carl Whitehead, Jr.

[57] ABSTRACT

A display device with LEDs includes an interconnection frame in which an electrical lead interconnection is formed by conductive metal plating on a surface including a main surface of a resin substrate capable of receiving a plating process. LEDs are bonded at the predetermined positions on the main surface of this interconnection frame so that they are connected to the electric lead interconnection. A reflection case having openings with their inner peripheral surfaces serving as reflection surfaces surrounding the LEDs is affixed to the main surface of the interconnection frame at a position corresponding to the LED arrangement. In the openings of the reflection case, the LEDs are covered with light transmissive resin members. Because the interconnection frame for the lead is formed of resin as well as the reflection case and provided with metal plating interconnection, thermal stresses are not produced due to difference of thermal expansion coefficient between the interconnection frame and the reflection case.

10 Claims, 8 Drawing Sheets

DISPLAY DEVICE WITH LEDS HAVING A REDUCTION OF THE THERMAL EXPANSION COEFFICIENTS AMOUNG THE ASSOCIATED COMPONENTS

BACKGROUND OF THE INVENTION

1. Field of the Invention

The present invention relates to a display device with LEDs (Light Emitting Diodes), and more particularly to a display device of a type in which LEDs are surrounded by a reflection case of a predetermined pattern to obtain a light emitting shape of that pattern by means of lightening of the LEDs. This display device with LEDs is, e.g. as a numeric and symbolic display device of a segment type, applied to a counter of a measuring instrument or a mechanical apparatus, or to display various physical quantities such as time.

2. Description of the Background Art

In conventional display devices with LEDs, there is a numeric and symbolic display device of a segment type as shown in FIG. 1. Such a display device, in which LEDs are attached in the respective grooves of a reflection case 1 having a plurality of reflection structures of a groove shape corresponding to the respective segments, displays desired figures by lightening predetermined LEDs according to a driving signal externally supplied through a lead 2.

Such conventional display devices with LEDs are generally divided into the following two types according to difference the of their structures.

One type of display device, referred to as a substrate type, has a sectional structure shown in FIG. 2. Referring to FIG. 2, in this display device, an LED 13 is mounted on an electrically interconnected substrate 14, and a reflecting case 11 having an upper surface on which a dispersion sheet 15 is attached is provided on the substrate 14. The LED 13 is fixed on the substrate 14 with a silver paste, electrically connected to the electric interconnection on the substrate 14 by means of bonding by a gold wire 16, and also electrically connected to outside portions by a pin 12 soldered to the substrate 14.

Another type of display device is referred to as a molded type, of which the sectional structure is shown in FIG. 3. In this display device, referring to FIG. 3, an LED 23 is mounted to one end of a formed lead frame 22, and the lead frame 22 and the LED 23 are connected with each other by means of bonding by a gold wire 26. The device has a structure in which the lead frame 22 provided with the LED 23 is inserted in a reflection case 21 having a groove-shaped reflection structure simultaneous with sealing by epoxy resin 24, and then the epoxy resin 24 is hardened. The LED 23 is electrically connected to outside portions through the respective lead terminals of the lead frame 22.

Among these conventional display devices, in the substrate type shown in FIG. 2, troubles arise such as positioning errors in providing the dispersion sheet 15, a defect that adhesive exudes outside the dispersion sheet 15, change in colors of the dispersion sheet 15 due to exposure to heat or solvents in the manufacturing process, and a defect due to dust stuck on the dispersion sheet 15. Accordingly, problems such as a decrease in quality and workability or an increase in cost arise. Furthermore, there is also a problem of moisture resistance because the device cannot be subjected to resin molding.

In the molded type shown in FIG. 3, there is no such problems as described above because the device does not use any dispersion sheet, and besides, the number of parts is decreased to enhance workability of assembling. However, since coefficients of thermal expansion of the lead frame 12 and the epoxy resin 14 are considerably different from each other, thermal stresses are likely to be produced in the resin. Therefore, defects in quality are developed that the LED is not lit because of cracks of the LED chip due to stresses, or because of disconnecting of a gold wire with a diameter of $25\mu m$–$30\mu m$ connecting a bonding pad (not shown) provided on the upper surface of the LED chip and the pad (not shown) on a lead frame. Furthermore, because of resin exfoliation between the outer peripheral surface of the LED chip and the resin layer surrounding it, there is an air layer between the LED chip and the resin layer. As a result, the light intensity of the LED decreases because of refraction at the boundary. Accordingly, troubles in quality are not avoided. Besides, having a large number of work steps in manufacturing, the device has a problem of high cost due to a decrease in workability.

SUMMARY OF THE INVENTION

It is an object of the present invention to try to decrease defects in quality such as cracks of LED chips and disconnecting of bonding wires by reducing the difference in thermal expansion coefficients among components to prevent thermal stresses from occurring.

A display device with LEDs of the present invention includes an interconnection frame which is formed by providing electric interconnection for use as leads by conductive metal plating on a surface including at least a main surface of a resin substrate composed of resin which can be subjected to a plating process. LEDs are bonded at predetermined positions on the main surface of this interconnection frame so that they are connected to the lead interconnection. A reflection case with openings having their inner peripheral surfaces serving as reflection surfaces surrounding the LEDs is affixed at the position corresponding to arrangement of LEDs on the main surface of the interconnection frame. In the openings of the reflection case, the LEDs are covered with light transmissive resin members.

According to the display device with LEDs of the present invention, because that lead interconnection is composed of resin as well as the reflection case and provided with metal plated interconnection, thermal stresses are decreased due to the difference of thermal expansion coefficients between the interconnection frame and the reflection case.

The display device with LEDs of the present invention is manufactured according to the following methods.

In the first method of manufacturing a display device with LEDs of the present invention, a resin substrate is first formed having a major surface on which LEDs are arranged and composed of resin which is capable of receiving a plating treatment. Next, to form an interconnection frame, a lead interconnection having a predetermined pattern is plated on a surface including at least the major surface of this interconnection frame. On the main surface of this interconnection frame, a reflection case having openings to expose this main surface and to make their peripheral surfaces serve as reflection surfaces is formed integrally with the interconnection frame. Subsequently, LEDs are bonded and connected to the lead interconnection at predetermined positions on the main surface of the interconnection frame within the openings of the reflection case. Then, light transmissive resin is injected into the openings of the reflection case and the LED chips are molded.

In the second method of manufacturing a display device with LEDs of the present invention, after forming an interconnection frame by means of the similar method to the above described first manufacturing method, LED chips are bonded and connected to the lead interconnection at predetermined positions on the main surface of the interconnection frame. Next, a reflection case having openings passing through it at the predetermined positions corresponding to the positions where the LED chips are bonded and reflection surfaces at inner peripheral surfaces of the openings, and light transmissive resin members for sealing the openings are integrally formed. Subsequently, the reflection case is connected and fixed to the interconnection frame so that the LEDs are covered with the light transmissive resin members in the openings.

According to the above described two manufacturing methods, the display devices with LEDs of the present invention are manufactured with excellent production efficiency.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a perspective view for describing a cutting pattern in case where a plurality of resin substrates 34 for interconnection frames are formed by cutting off a single resin board 34a.

DESCRIPTION OF THE PREFERRED EMBODIMENTS

Figure 4A:
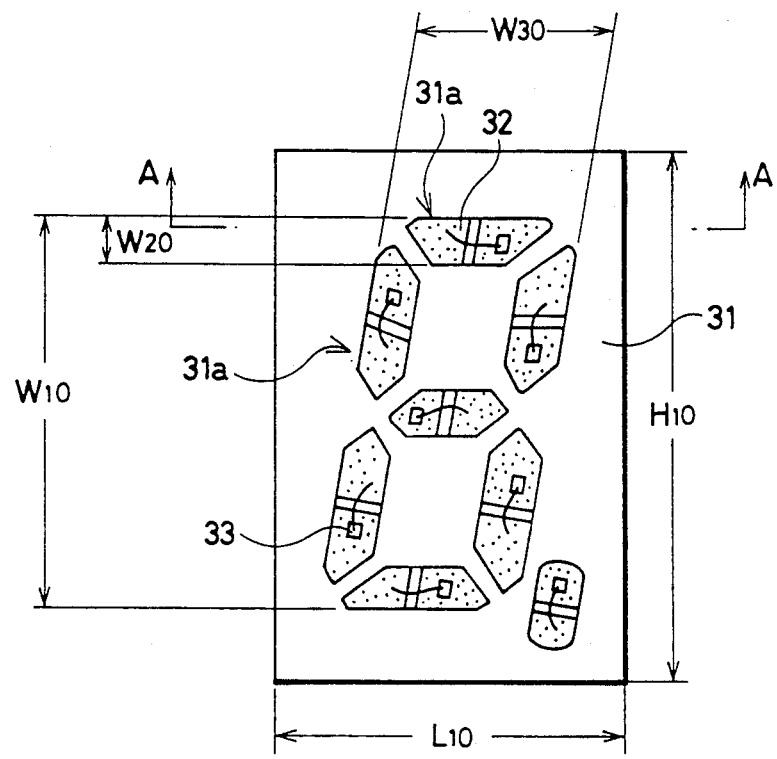
FIG. 4A is a plan view of a display device with LEDs in the first embodiment of the present invention.
Figure 4B:
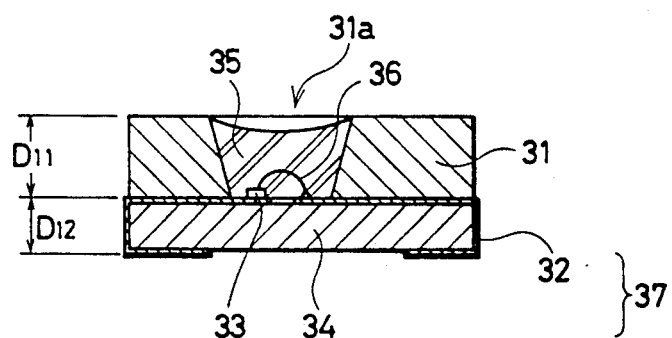
FIG. 4B is an A—A sectional view thereof.
Figure 4C:
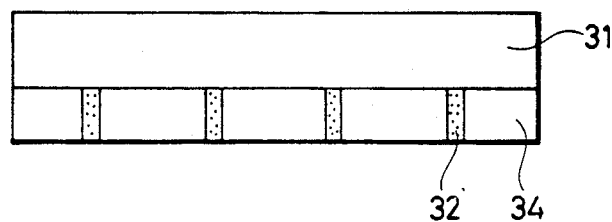
FIG. 4C is a right side view of FIG. 4A.

One embodiment of the present invention will be described below on the basis of FIGS. 4A-C. FIGS. 4A-C are a plan view, a front sectional view and a right side view of a display device with LEDs of one embodiment of the present invention, respectively. Referring to these figures, a plurality of reflection segments 31a forming a display pattern such as a figure together are provided in a reflection case 31 formed of resin. Each reflection segment 31a is composed of an opening having taper-like inner peripheral surfaces, and the inner peripheral surfaces serve as reflection surfaces reflecting the light of an LED. The main surface of an interconnection frame 37 formed by providing a lead interconnection 32 having a predetermined pattern on a resin substrate 34 is connected to the lower end surface of the reflection case 31. The lead interconnection 32 is formed by conductive metal plating from the upper main surface to the lower surface by way of the side surface of the resin substrate 34. An LED 33 is provided on the main surface of the interconnection frame 37 located at a bottom surface of the opening forming each reflection segment 31a, and bonded by a gold wire 36 to be electrically connected to the lead interconnection 32. Terminals of each LED 33 are led to the lower surface of interconnection frame 37 by the lead interconnection 32.

The LED 33 in each reflection segment 31a is molded with a light transmissive resin member 35, respectively. This light transmissive resin member 35 should be composed of resin having excellent adhesive property to a chip and also having excellent moisture and thermal resistance, which is generally formed by molding with transparent epoxy resin.

Figure 4D:
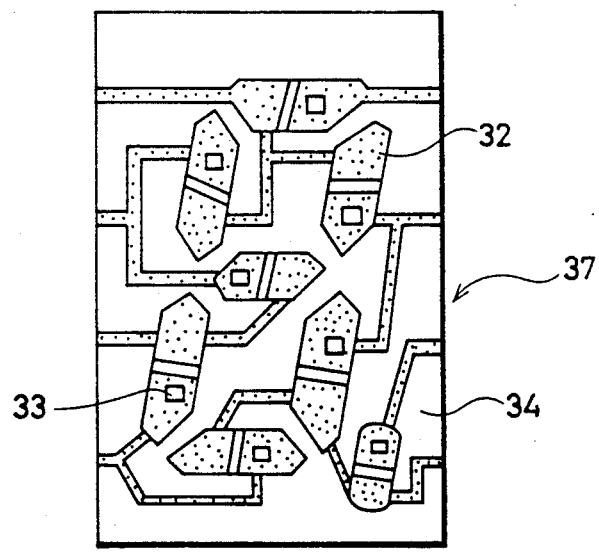
FIG. 4D is a plan view showing one example of an interconnection pattern of an interconnection frame.

An example of an interconnection pattern on a surface of the interconnection frame 37 in this embodiment is shown in FIG. 4D.

An example of a process for manufacturing a display device with LEDs of the present embodiment will be described below on the basis of FIGS. 5A-E.

Figure 5A:
FIGS. 5A, 5B, 5C, 5D and 5E are sectional views sequentially showing a display device with LEDs in one embodiment of the present invention at the respective manufacturing steps.
Figure 5B:
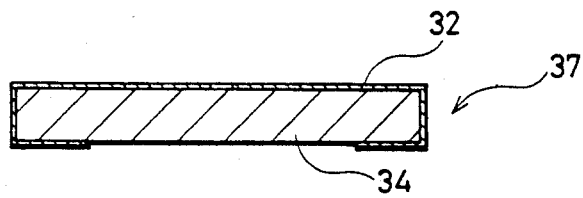

First, referring to FIG. 5A, a plain-board-like resin substrate 34 is formed. For this resin substrate 34, for example, a liquid crystal polymer is employed which is capable of receiving conductive metal plating on the surface thereof. Next, referring to FIG. 5B, a lead interconnection 32 extending from the top main surface of the resin substrate 34 through the side surface to the bottom surface is formed by the conductive metal plating and the subsequent patterning by etching is applied thereto to complete the interconnection frame 37. The liquid crystal polymer employed as the material for the resin substrate 34 of the interconnection frame 37 includes "VECTRA" by Polyplastics Kabushiki-Kaisha and "XYDAR" by DARTOCO CORPORATION (ITALY). Both "VECTRA" and "XYDAR" are composed of thermotropic fully aromatic liquid crystal polyester. A method of conductive metal plating used is the method described in detail in p.7 of "Guide to MID (Molded Interconnection Device) . . . ", for example, which is a description of "VECTRA" by POLYPLASTICS CORPORATION. As the material for metal plating, a single layer of a copper plating layer, a silver plating layer or a gold plating layer, or a combination including two or more of the layers is used, the thickness of the plating layer is less than several μm.

As for a specific combination of metal plating materials, it is preferable to employ copper as a substrate metal and coat the copper with a nickel plating layer and a gold plating layer as anti-oxidative metals, for example. In patterning the lead interconnection on the resin substrate 34, after completion of metal plating, a resist mask with a predetermined pattern is formed by photolithography, and the resist mask is peeled off after etching.

Next, a reflection case 31 is formed on the interconnection frame 37 by a so called insert molding method. Thus, the reflection case 31 and the interconnection frame 37 are integrally formed. In the insert molding in this case, as will be described in detail below, the interconnection frame 37 is inserted into a forming metal mold in advance, and subsequently resin is poured and formed in the forming metal mold for the material of the reflection case 31.

Figure 5C:
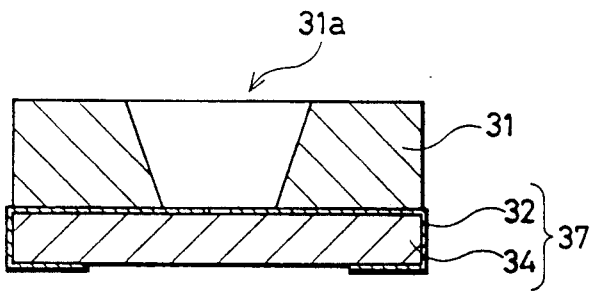
Figure 5D:
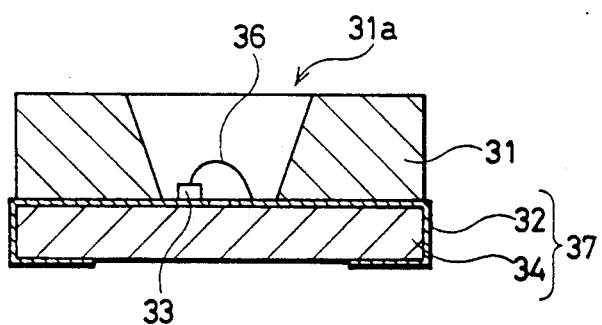

Then, referring to FIG. 5D, the LED 33 is bonded on the lead interconnection 32 at the main surface of the interconnection frame 37 located at the bottom portion of the reflection segment 31a, and is further bonded by the gold wire 36, so that the lead interconnection 32 and the LED are electrically connected.

Figure 5E:
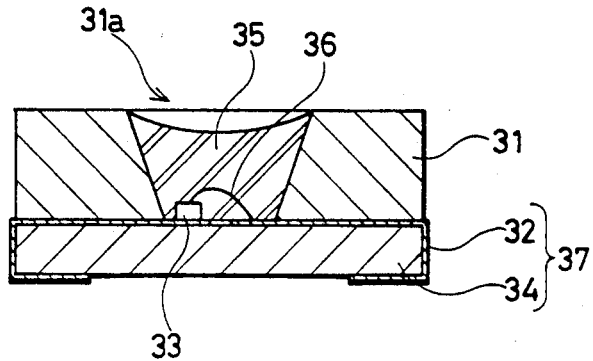

Next, referring to FIG. 5E, light transmissive epoxy resin is injected into the opening of the reflection segment 31a, the LED is molded thereby, and then a display device with LEDs of this embodiment is completed.

Figure 6A:
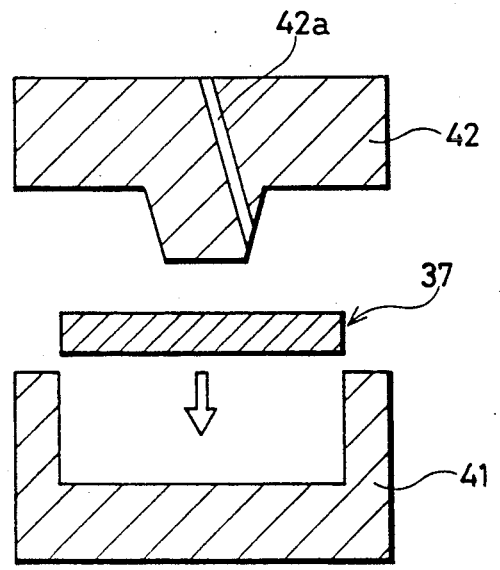
FIGS. 6A, 6B, and 6C are sectional views sequentially showing the steps for forming a reflection case 31 integrally with an interconnection frame 37 by an insert molding method.
Figure 6B:
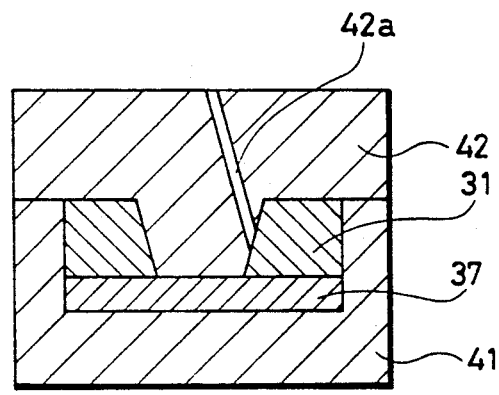
Figure 6C:
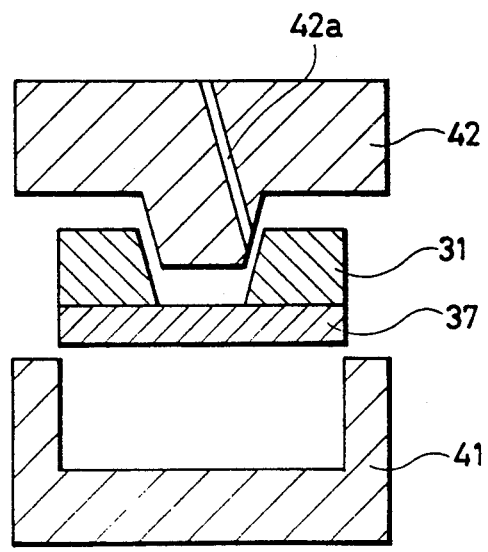

Among the manufacturing steps described above, a step of the insert molding for forming the structure shown in FIG. 5C will be described referring to FIGS. 6A-C. First, referring to FIG. 6A, the interconnection frame 37 is inserted into a downside mold 41. Next, referring to FIG. 6B, an upside mold 42 is made to abut against the downside mold 41 so that the interconnection frame 37 is pressed from upside. In this condition, liquid resin is supplied through a resin supply hole 42a to integrally form the reflection case 31 on the interconnection frame 37. Furthermore, referring to FIG. 6C, by separating the downside mold 41 and the upside mold 42 after the liquid resin for forming the reflection case 31 is hardened, an integral molded product of the interconnection frame 37 and the reflection case 31 is obtained. By using this insert molding method, positioning and joining of the reflection case 31 onto the interconnection frame 37 can be performed simultaneously and highly precisely.

Figure 1:
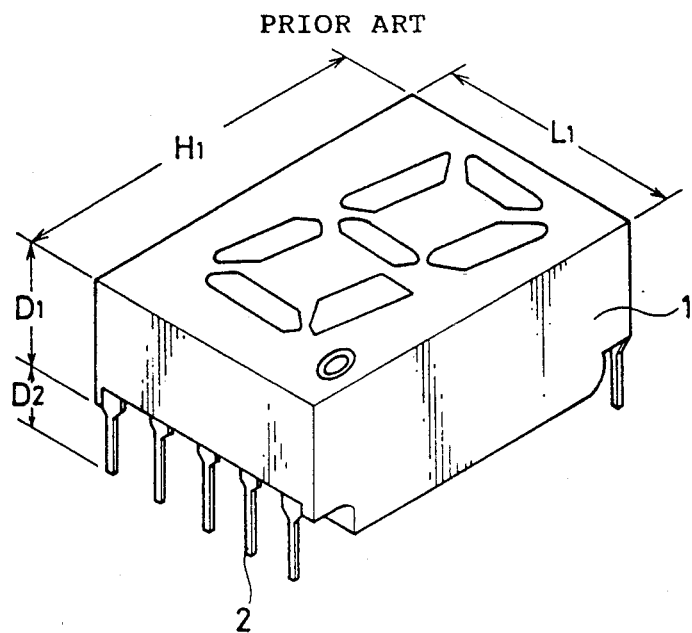
FIG. 1 is a perspective view showing external appearance of a conventional display device with LEDs.
Figure 2:
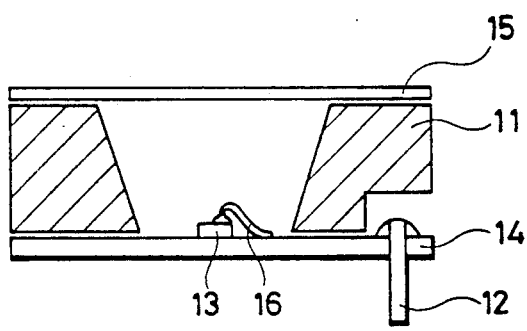
FIG. 2 is a sectional view showing structure referred to as substrate type among conventional display devices with LEDs.
Figure 3:
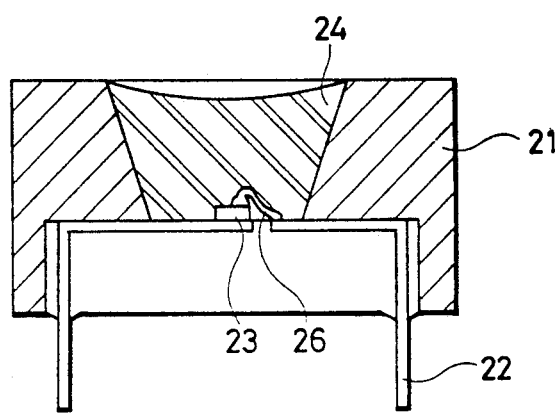
FIG. 3 is a sectional view showing structure referred to as molded type among conventional display devices with LEDs.

A detailed embodiment of the present invention will be described. In FIG. 1, in a conventional LED display device, a width L1 is 10.16 mm, a height H1 is 15.00 mm, a thickness D1 is 6.5 mm, and a length of the lead D2 is 3.5 mm. Meanwhile, in FIG. 4A of the present invention, a width L10 is 7.0 mm, a height H10 is 11.0 mm, a height of a character W10 is 8.0 mm, a width of the character W30 is 4.0 mm, and a width of 1 segment of the character is 1.0 mm. In FIG. 4B of the present invention, the thickness of a reflection case 31 D11 is 1.0 mm and thickness D12 of a resin substrate 34 for frame is 1.0 mm, so that the entire thickness of the LED display device is 2.0 mm, which is extremely thin and small. In a conventional manufacturing method, it has been difficult to manufacture such a fine and precise LED display device. Also, because the surface of the lead interconnection 32 is covered with an anti-oxidative metal having a high the reflection rate and the thickness of the reflection case 31 is thin (1.0 mm, for example), utilization efficiency of light emitted by the LED chip can be increased, and in one example, it can be increased to 2-7 times as compared to the luminance of a conventional LED.

Figure 7A:
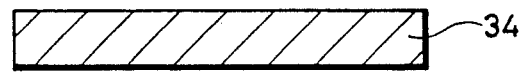
FIGS. 7A, 7B, 7C, 7D and 7E are sectional views sequentially showing a display device with LEDs in one embodiment of the present invention at other manufacturing steps.
Figure 7B:
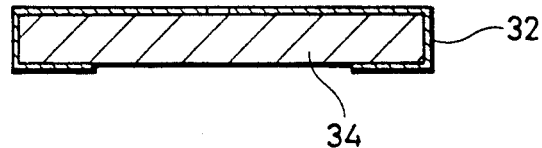
Figure 7C:
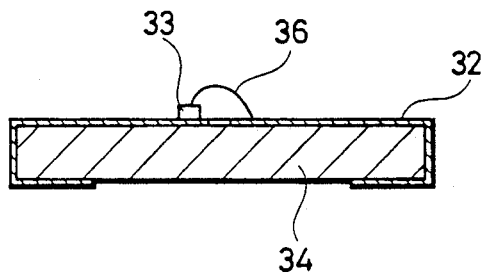

As a method of manufacturing a display device with LEDs of the present embodiment, the steps shown in FIGS. 7A-7E can also be used. In these manufacturing steps, the steps for forming the interconnection frame 37 shown in FIGS. 7A and 7B are similar to the above described manufacturing steps shown in FIGS. 5A and 5B. In this manufacturing process referring to FIG. 7C, after forming the interconnection frame 37, an LED chip 33 is bonded on the lead interconnection 32 at its main surface, and by further bonding by the gold wire 367, the LED 33 and the lead interconnection 32 are electrically connected.

Figure 7D:
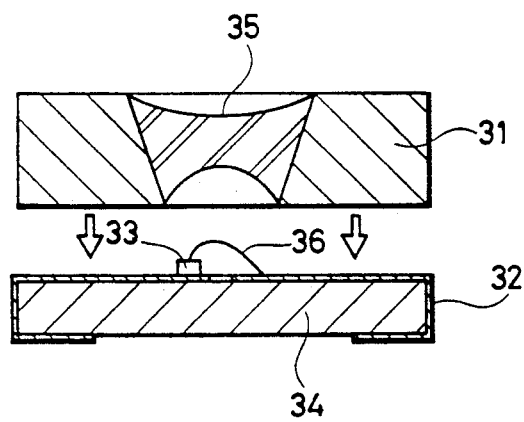
Figure 7E:
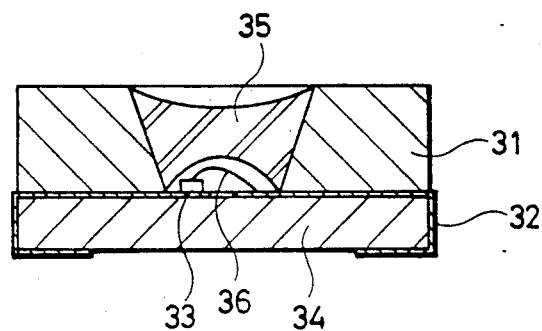
Figure 8A:
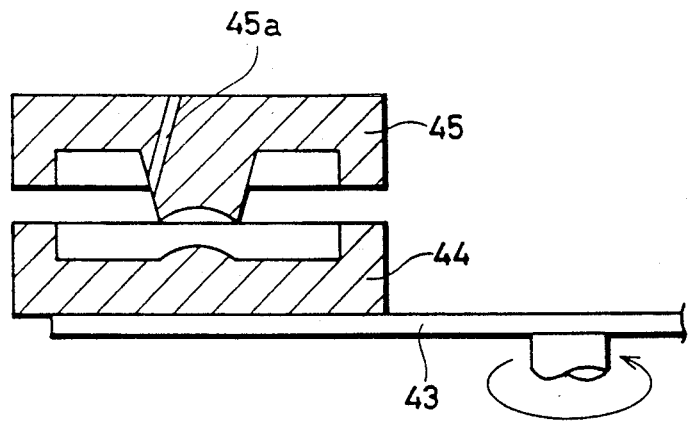
FIGS. 8A, 8B, 8C, and 8D are sectional views sequentially showing the steps for forming transparent resin member 35 in reflection segment 31a of reflection case 31 by a two-color molding method.
Figure 8B:
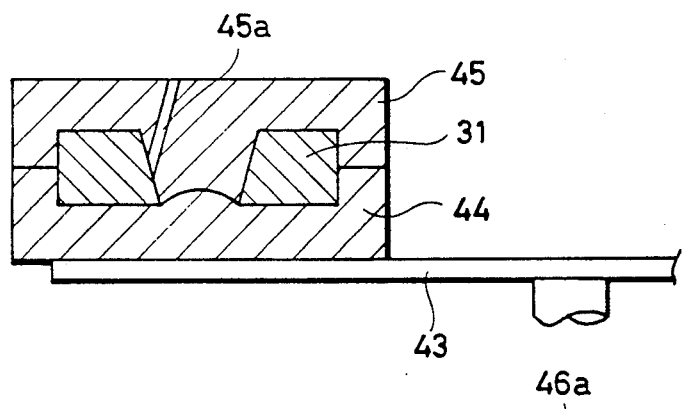
Figure 8C:
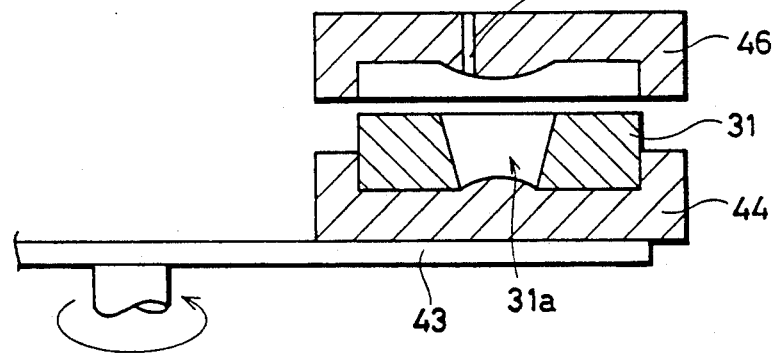
Figure 8D:
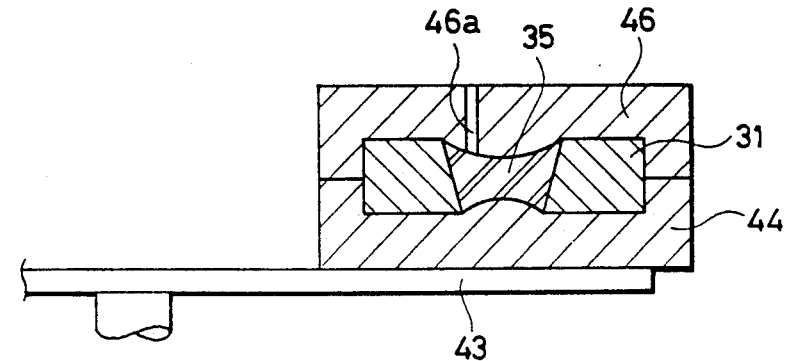

Next, referring to FIG. 7D, the reflection case 31 and the light transmissive resin member 35 are integrally formed by a so-called two-color molding method described later in detail, which is affixed to the main surface of the interconnection frame 37, for completing the structure as shown in FIG. 7E.

Here, in the case of using this manufacturing method, the LED 33 is not filed with the transparent resin member 35, but the LED 33 and the gold wire 36 are covered with a concave portion formed at the bottom surface of the transparent resin member 35.

Among the above described manufacturing steps, a description will be given about the two-color molding method for forming an integral production of the reflection case 31 and the transparent resin member 35 shown in FIG. 7D referring to FIGS. 8A-D. First, referring to FIG. 8A, the angle of rotation of a base plate 43 is adjusted so that the downside mold 44 carried on the rotating base plate 43 is located right under a first fixed upside mold 45. Next, referring to FIG. 8B, the rotating base plate 43 is raised to make the downside mold 44 abut against the first fixed upside mold 45, the liquid resin is supplied though a resin supply hole 45a to form the reflection case 31. Subsequently, referring to FIG. 8C, after the liquid resin is cooled and hardened, the rotating base plate 43 is descended to separate the downside mold 44 and the reflection case 31 from the first fixed upside mold 45, and turned a predetermined angle (for example, 180°), where the angle of rotation of the fixed base plate 43 is adjusted to locate the downside mold 44 right under a second fixed upside mold 46. Moreover, referring to FIG. 8D, the rotating base plate 43 is raised to make the downside mold 44 abut against the second fixed upside mold 46, and liquid light transmissive resin is supplied through a resin supply hole 46a to form the light transmissive resin member 35 in the reflection segment 31a of the reflection case 31. After cooling and hardening the light transmissive resin member 35, the rotating base plate 43 is descended to separate the downside mold 44 and the second fixed upside mold 46, so that an integral formed production of the reflection case 31 and the light transmissive resin member 35 can be taken out. By employing this two-color molding method, integral forming of the reflection case 31 and the light transmissive resin member 35 can be efficiently performed. Also, since high temperature liquid resin is not directly injected onto the LED 33, the gold wire 36 or the interconnection frame 37, damage due to heat can be prevented.

Figure 9:
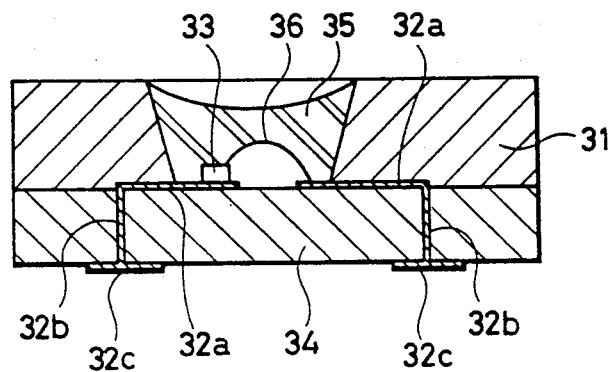
FIG. 9 is a sectional view showing structure of a display device with LEDs in another embodiment of the present invention.

In the present invention, a structure having a section as shown in FIG. 9 can be introduced other than the structure shown in FIG. 4b. That is to say, in the embodiment of FIG. 4B, the lead interconnection 32 was led to the bottom surface of the resin substrate 34 through its side surface, but in the example of FIG. 9, the lead interconnection 32a by metal plating formed on the upper surface of the resin substrate 34 is connected to electrodes 32c on the bottom surface through the through holes 32b.

Also, in the present invention, it is not essential to lead the lead the interconnection 32 to the bottom surface of the resin substrate 34, but the lead interconnection 32 can be led only to the side surface. Thus, just leading the lead the interconnection 32 to the side surface of the resin substrate 34 enables the structure to be implemented in which the interconnection frame 37 is put into a female socket.

Figure 10:
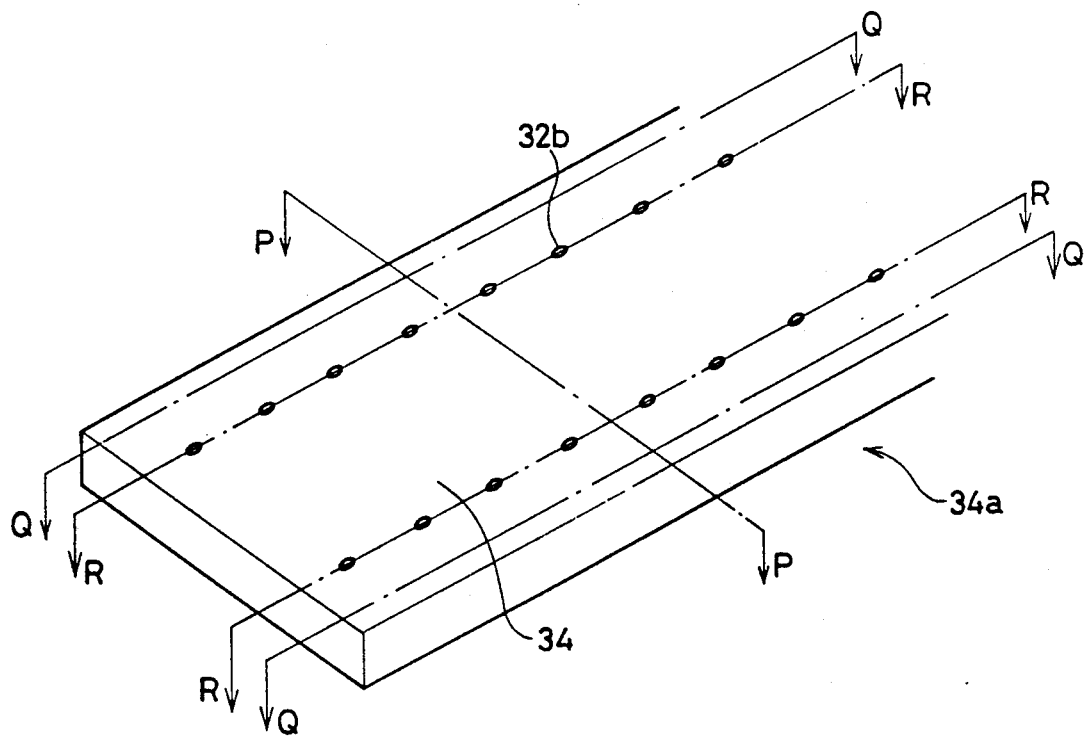

The resin substrate 34 of the interconnection frame 37 can be formed one by one, but generally a plurality of substrates can be formed at a time by cutting an elongated resin board 34a having through holes 32b formed by applying injection molding to polycarbonate. When forming the interconnection frame 37 shown in FIG. 4B, interconnection frame 37 is cut off along the section indicated by the dashed line P—P and the section indicated by the dashed line Q—Q as illustrated in FIG. 10 forming the interconnection frame 37 shown in FIG. 9, the interconnection frame 37 is cut off along the section indicated by the dashed line P—P and the section indicated by the dashed line R—R.

According to the display device with LEDs shown in each of the above embodiments, as the lead frame is formed by conductive metal plating, lead terminals and pins can be omitted. As a result, protruding portions, which may damage parts around it in transportation, can be eliminated, and also it can be employed as SMT (Surface Mounting Technology). Besides, so called taping packaging in which parts are put in a concave-shaped packaging container and packed with a lid having an adhesive material is enabled, which makes it easy for users to assemble it.

It also has effect that the a width and a height of a LED display device, the magnitude of a character, the a width of one segment of the character, the thickness of the the reflection case and the thickness of the LED display device can be made extremely thin and small. The utilization efficiency of the light emitted by the LED chip can be increased, and in one example, it has an effect to increase the same to 2-7 times as compared to the luminance of a conventional LED.

Although the present invention has been described and illustrated in detail, it is clearly understood that the same is by way of illustration and example only and is not the present invention. All modifications as would be obvious to one skilled in the art are intended to be included within the scope of the appended claims.

What is claimed is:

1. A display device comprising:
   an interconnection frame including,
      a resin substrate having a top surface, opposite side surfaces and a bottom surface opposite said top surface and formed of resin capable of receiving a conductive plating process, and
      an electric lead interconnection formed by conductive matel plating on at least said top surface of said resin substrate and defining a main surface of the interconnection frame, said electric lead interconnection being led to either one of a bottom surface of said resin substrate, a side surface of said resin substrate, and both said bottom surface and said side surface of said resin substrate;
   an LED located at a predetermined position on said main surface of said interconnection frame and bonded to be connected to said electric led interconnection;
   a reflection use formed of resin having an opening and an inner peripheral surface serving as a reflection surface surrounding said LED at a position corresponding to the arrangement of said LED, and affixed to said main surface of said interconnection frame; and
   a light transmissive resin member covering said LED in said opening of said reflection case.

2. The display device according to claim 1, wherein said LED is molded with said light transmissive resin member.

3. The display device according to claim 1, wherein said light transmissive resin member comprises a concave portion at a bottom surface and said LD is covered in said concave portion.

4. The display device according to claim 1, wherein said light transmissive resin member comprises said transparent epoxy resin.

5. The display device according to claim 1, wherein said resin substrate comprises a liquid crystal polymer.

6. The display device according to claim 1, wherein said lead the interconnection comprises one metal plating layer selected out of a copper plating layer, a silver plating layer and a gold plating layer.

7. The display device according to claim 1, wherein aid lead interconnection comprises a copper plating layer as a substrate metal and an nickel layer and a gold layer as anti-oxidateive metals above said copper plating layer.

8. The display device according to claim 1, wherein aid lead interconnection comprises at least two metal plating layers selected out of a copper plating layer, a silver plating layer and a gold plating layer.

9. The display device according to claim 1, wherein aid lead interconnection comprises a copper plating layer as a substitute metal layer and either one of a nickel layer and a gold layer as an anti-oxidateive metal above said upper plating layer.

10. The display device according to claim 1, wherein said lead interconnection extends and is located on said side surface and covers a portion of said bottom surface.

* * * * *